United States Patent
Hwang et al.

(10) Patent No.: US 7,907,026 B2
(45) Date of Patent: Mar. 15, 2011

(54) BROADBAND VOLTAGE CONTROLLED OSCILLATOR AND METHOD FOR GENERATING BROADBAND OSCILLATION FREQUENCY

(75) Inventors: Sang Hoon Hwang, Seoul (KR); Tah Joon Park, Suwon-si (KR); Myeung Su Kim, Suwon-si (KR); Kyung Hee Hong, Seoul (KR); Joon Hyung Lim, Gunpo-si (KR); Yong Il Kwon, Suwon-si (KR)

(73) Assignee: Samsung Electro-Mechanics Co., Ltd., Suwon-si, Gyunggi-do (KR)

( * ) Notice: Subject to any disclaimer, the term of this patent is extended or adjusted under 35 U.S.C. 154(b) by 13 days.

(21) Appl. No.: 12/358,887

(22) Filed: Jan. 23, 2009

(65) Prior Publication Data
US 2010/0117740 A1   May 13, 2010

(30) Foreign Application Priority Data
Nov. 7, 2008   (KR) .................. 10-2008-0110291

(51) Int. Cl.
*H03B 5/12*   (2006.01)
(52) U.S. Cl. ................... 331/117 FE; 331/179
(58) Field of Classification Search ............ 331/179, 331/117 FE, 117 R, 167, 177 R, 177 V, 34, 331/36 C, 16, 182, 183, 185, 186, 57
See application file for complete search history.

(56) References Cited

U.S. PATENT DOCUMENTS

| | | | |
|---|---|---|---|
| 7,061,334 B1 * | 6/2006 | Baig et al. | 331/57 |
| 7,259,638 B2 * | 8/2007 | Takahashi | 331/179 |
| 7,336,134 B1 * | 2/2008 | Janesch et al. | 331/36 C |
| 7,342,464 B2 * | 3/2008 | Hino | 331/167 |

FOREIGN PATENT DOCUMENTS

| | | |
|---|---|---|
| JP | 2008-148210 A | 6/2008 |
| KR | 10-2006-0129095 A | 12/2006 |

* cited by examiner

*Primary Examiner* — Robert Pascal
*Assistant Examiner* — Ryan Johnson
(74) *Attorney, Agent, or Firm* — Lowe, Hauptman, Ham & Berner, LLP

(57) ABSTRACT

The present invention relates to a broadband voltage controlled oscillator and a method for generating a broadband oscillation frequency; and, more particularly, to a broadband voltage controlled oscillator and a method for generating a broadband oscillation frequency capable of operating over a wide frequency band by including a weighted current cell to select two frequency band modes, generating various levels of total 64 oscillation frequencies by including a variable frequency tank and a capacitor bank, and further facilitating adjustment of the total 64 oscillation frequencies distributed over the wide frequency band by including a control signal generator for generating control signals each of which is applied to the weighted current cell, the variable frequency tank and the capacitor bank by a BDD (Binary Decision Diagram) technique.

20 Claims, 5 Drawing Sheets

[FIG. 1]
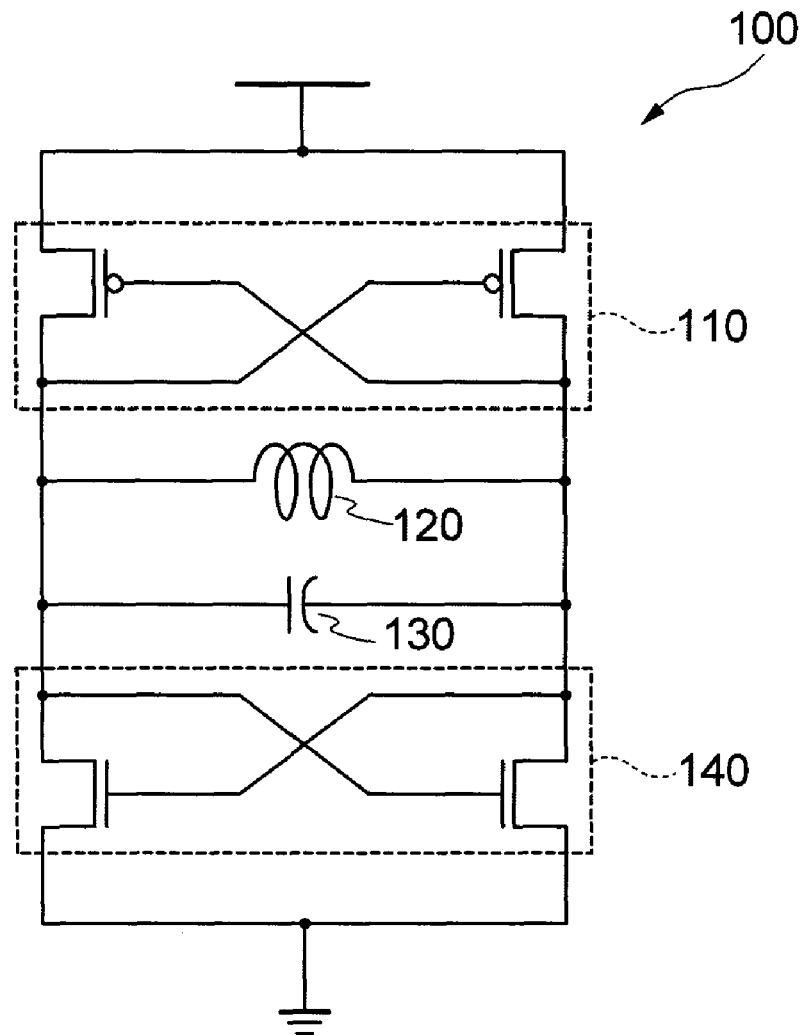
- PRIOR ART -

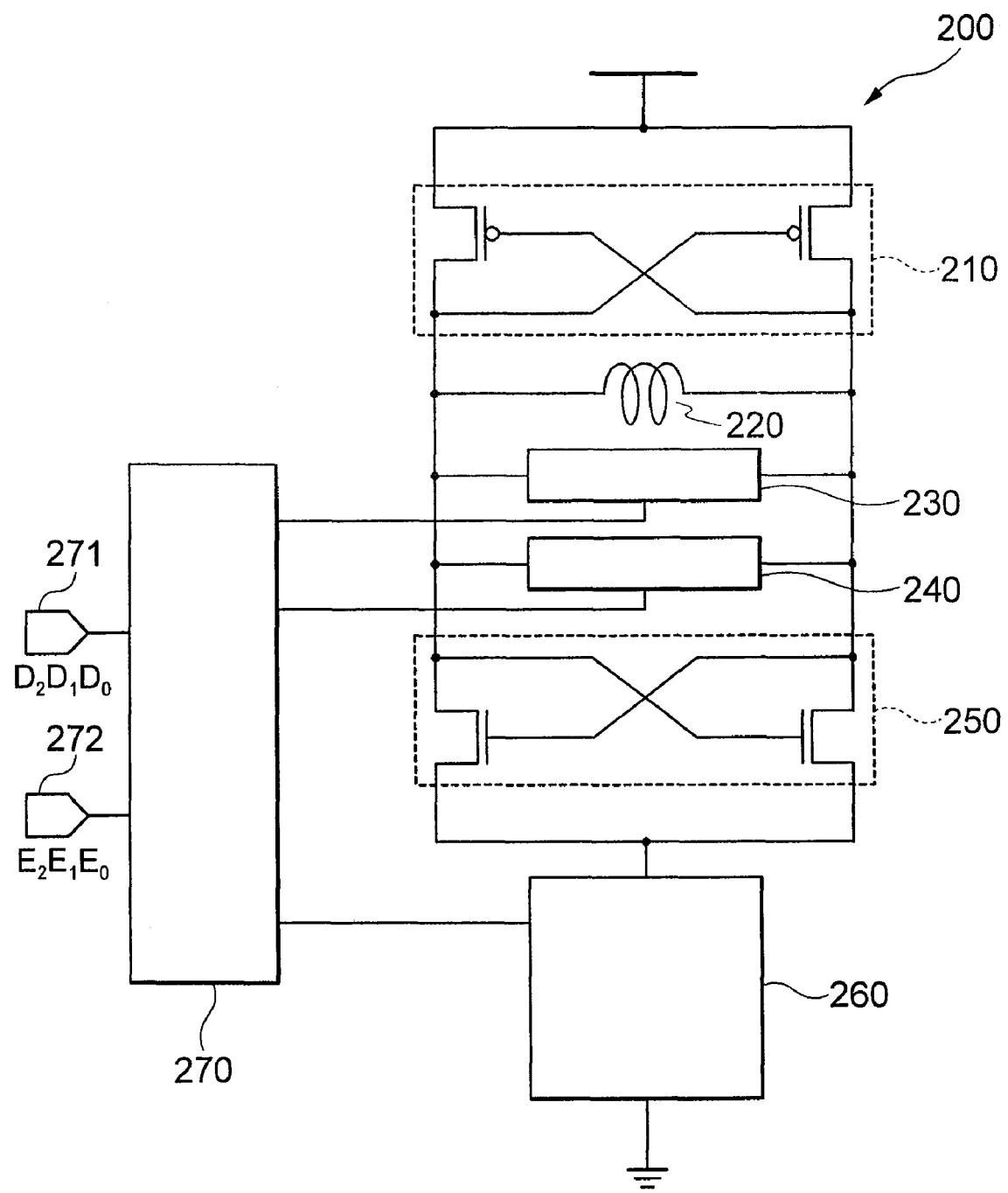
[FIG. 2]

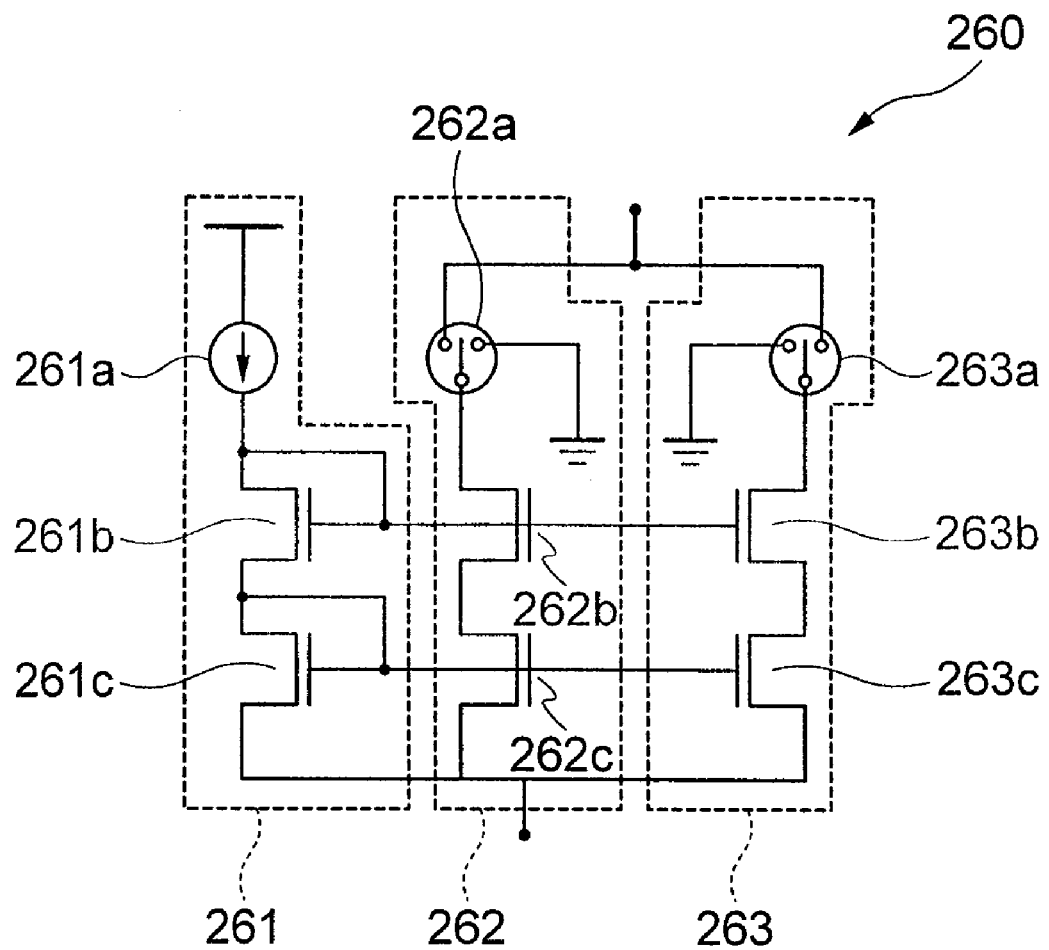
[FIG. 3]

[FIG. 4]
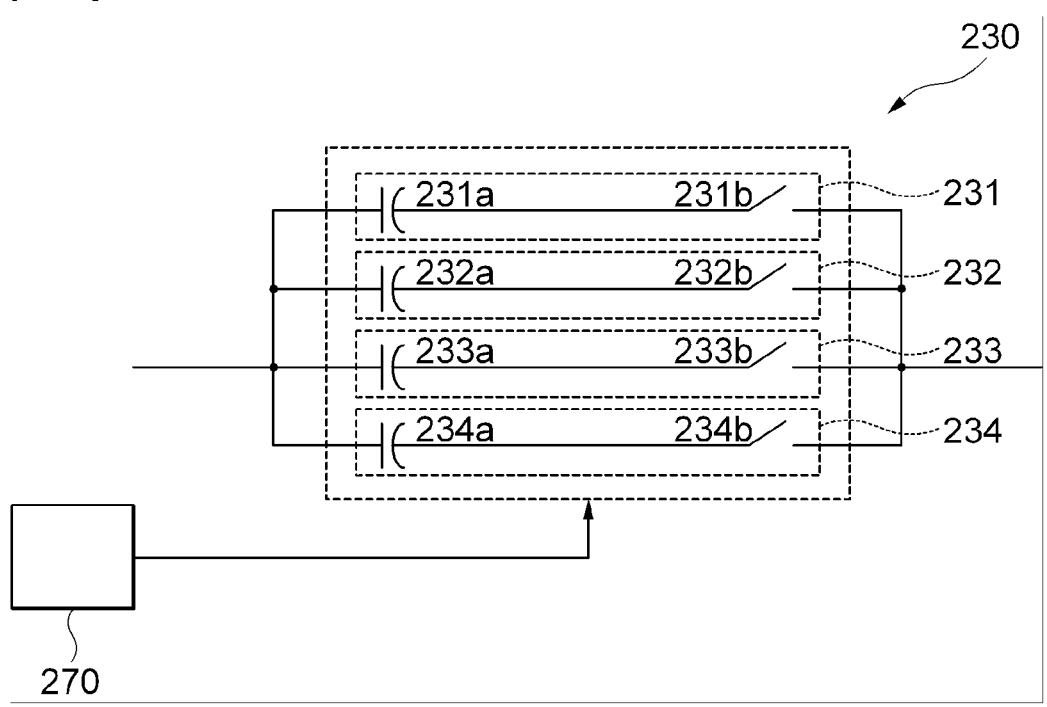

[FIG. 5]
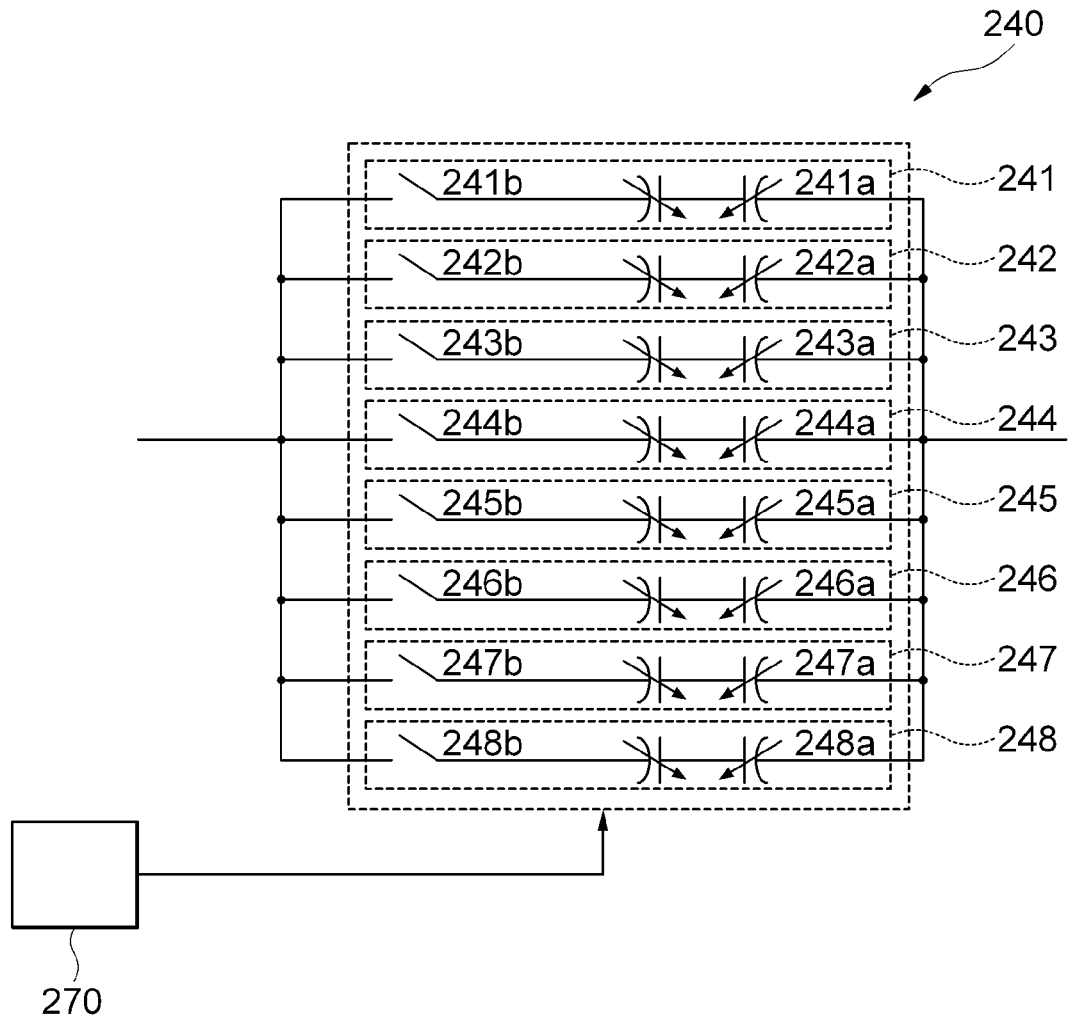

BROADBAND VOLTAGE CONTROLLED OSCILLATOR AND METHOD FOR GENERATING BROADBAND OSCILLATION FREQUENCY

CROSS-REFERENCE TO RELATED APPLICATIONS

This application claims the benefit of Korean Patent Application No. 10-2008-0110291 filed with the Korea Intellectual Property Office on Nov. 7, 2008, the disclosure of which is incorporated herein by reference.

BACKGROUND OF THE INVENTION

1. Field of the Invention

The present invention relates to a broadband voltage controlled oscillator and a method for generating a broadband oscillation frequency; and, more particularly, to a broadband voltage controlled oscillator and a method for generating a broadband oscillation frequency capable of operating over a wide frequency band by including a weighted current cell to select two frequency band modes, generating various levels of total 64 oscillation frequencies by including a variable frequency tank and a capacitor bank, and further facilitating adjustment of the total 64 oscillation frequencies distributed over the wide frequency band by including a control signal generator for generating control signals each of which is applied to the weighted current cell, the variable frequency tank and the capacitor bank by a BDD (Binary Decision Diagram) technique.

2. Description of the Related Art

In general, a VCO (Voltage Controlled Oscillator) is a module for varying a resonated frequency by varying capacitance of a varactor through an inputted tuning voltage and oscillating and amplifying the resonated frequency and is widely utilized within an RF transceiver of a PCS or a CDMA terminal.

The RF transceiver mostly employs a frequency synthesizer using a PLL (Phase Locked Loop) of an LC-VCO type, i.e., a VCO type including an inductor and a capacitor. The VCO type including the inductor and the capacitor has advantages in that a high frequency of several GHz band can be generated and in an oscillation frequency characteristic, a phase noise characteristic is excellent.

Recently, with development of wire communication and a various market change, a need is increasing to provide a frequency synthesizer which operates in a wide range in order to transmit large-capacity information. However, the inductor and the capacitor are changed in the characteristics thereof at the high frequency and therefore it is difficult for the VCO type including the inductor and the capacitor to generate the oscillation frequency of a wide operation range.

Hereinafter, the VCO in accordance with the prior art will be described in detail with reference to the accompanying drawing.

FIG. 1 shows a circuit diagram of the VCO 100 in accordance with the prior art.

As shown in FIG. 1, the VCO 100 in accordance with the prior art includes a first negative-resistance unit 110, an inductor 120, a capacitor 130 and a second negative-resistance unit 140.

The VCO 100 in accordance with the prior art generates a center frequency by calculating values of the inductor and the capacitor by an equation of $f=1/(LC)^{1/2}$ for a single oscillation frequency band and makes switch banks with capacitors having small capacitance in order to generate channel frequencies corresponding to each of the switch banks. Herein, the channel frequencies are within a narrow range with respect to the center frequency due to the characteristics of the inductor and the capacitor at a high frequency.

Therefore, the VCO 100 in accordance with the prior art de-multiplies and uses the oscillation frequency band generated as described above in order to use a low frequency. For instance, an oscillation frequency band of 1.6 GHz to 1.8 GHz is used by being de-multiplied into a frequency band of 800 MHz to 900 MHz and in order to use a frequency band lower than the frequency band, the frequency band of 800 MHz to 900 MHz is de-multiplied into 400 MHz to 450 MHz.

However, the prior art has problems in that the phase noise characteristic is deteriorated and phase noise of a low frequency band further influences a high frequency band as the oscillation frequency band generated by the VCO is de-multiplied.

SUMMARY OF THE INVENTION

The present invention has been invented in order to overcome the above-described problems and it is, therefore, an object of the present invention to provide a broadband voltage controlled oscillator and a method for generating a broadband oscillation frequency capable of operating over a wide frequency band by including a weighted current cell to select two frequency band modes, generating various levels of total 64 oscillation frequencies by including a variable frequency tank and a capacitor bank, and further facilitating adjustment of the total 64 oscillation frequencies distributed over the wide frequency band by including a control signal generator for generating control signals each of which is applied to the weighted current cell, the variable frequency tank and the capacitor bank by a BDD (Binary Decision Diagram) technique.

In accordance with one aspect of the present invention to achieve the object, there is provided a broadband voltage controlled oscillator including a weighted current cell for selecting a plurality of frequency band modes; a capacitor bank for adjusting an oscillation frequency at a plurality of levels in the frequency band mode selected by the weighted current cell; a variable frequency tank for re-adjusting the oscillation frequency adjusted by the capacitor bank at a plurality of levels; and a control signal generator for receiving digital signals and converting the digital signals into control signals each of which is applied to the weighted current cell, the capacitor bank and the variable frequency tank by a BDD (Binary Decision Diagram) technique.

It is preferable that the control signal generator includes a first input terminal to which N bit (N is an integer of more than 1) digital signals $D_0, D_1, \ldots$ and $D_N$ are inputted and a second input terminal to which M bit (M is an integer of more than 1) digital signals $E_0, E_1, \ldots$ and $E_N$ different from the N bit digital signals are inputted.

It is more preferable that the N bit digital signals can be 3 bit digital signals $D_0, D_1$ and $D_2$ and the M bit digital signals can be $E_0, E_1$, and $E_2$.

It is more preferable that the weighted current cell can select a first frequency band mode if $D_2$ is 0 and select a second frequency band mode different from the first frequency band mode if $D_2$ is 1.

It is more preferable that the weighted current cell includes a first stage including a current source, a first transistor and a second transistor which are connected to each other in series and supplying a constant current to the weighted current cell; a second stage including a first switch, a third transistor and a fourth transistor which are connected to each other in series and supplying a current quantity needed to select the first frequency band mode; and a third stage including a second switch, a fifth transistor and a sixth transistor which are connected to each other in series and supplying a current quantity needed to select the second frequency band mode.

It is preferable that the first switch and the second switch are complementarily opened and closed according to a value of $D_2$.

It is preferable that ratios (W/L) of channel width (W) to channel length (L) of the first transistor and the second transistor are equal to each other, ratios of channel width to channel length of the third transistor and the fourth transistor are equal to each other, and ratios of channel width to channel length of the fifth transistor and the sixth transistor are equal to each other.

It is more preferable that current quantity ($I_2$) flowing in the second stage is expressed as the following equation:

$$I_2 = I_1 \times \{(3\_W/L)/(1\_W/L)\} \text{ and}$$

quantity ($I_3$) of a current flowing in the third stage is expressed as the following equation:

$$I_3 = I_1 \times \{(5\_W/L)/(1\_W/L)\}$$

(wherein, $I_1$ is quantity of a current flowing in the first stage, $1\_W/L$ is a ratio of channel width to channel length of the first transistor, $3\_W/L$ is a ratio of channel width to channel length of the third transistor, and $5\_W/L$ is a ratio of channel width to channel length of the fifth transistor).

It is preferable that the oscillation frequency adjusted by the capacitor bank is adjusted at 4 levels in each of the first frequency band mode and the second frequency band mode according to combinations of ($D_1, D_0$).

It is more preferable that the capacitor bank includes a plurality of capacitor units connected to each other in parallel and each of the capacitor units includes a single capacitor and a single capacitor switch connected to the capacitor in series.

It is more preferable that each combination of conducted capacitor switches among the capacitor switches of the capacitor units is different according to the combinations of ($D_1, D_0$) in the first frequency band mode and the second frequency band mode.

It is preferable that the variable frequency tank re-adjusts the frequency adjusted by the capacitor bank at 8 levels according to combinations of ($E_0, E_1, E_2$).

It is more preferable that the variable frequency tank includes a plurality of varactor units connected to each other in parallel and each of the varactor units includes a single varactor and a single varactor switch connected to the varactor in series.

It is more preferable that each combination of conducted varactor switches among the varactor switches of the varactor units is different according to the combinations of ($E_0, E_1, E_2$) in the first frequency band mode and the second frequency band mode.

In accordance with another aspect of the present invention to achieve the object, there is provided a method for generating a broadband oscillation frequency including steps of: (a) receiving digital signals and converting the digital signals into control signals each of which is applied to a weighted current cell, a capacitor bank and a variable frequency tank by a BDD (Binary Decision Diagram) technique by a control signal generator; (b) selecting a plurality of frequency band modes by the weighted current cell; (c) adjusting an oscillation frequency at a plurality of levels in the selected frequency band mode by the capacitor bank; and (d) re-adjusting the adjusted oscillation frequency at a plurality of levels by the variable frequency tank.

It is preferable that the step of (a) includes a step of: inputting N bit (N is an integer of more than 1) digital signals $D_0, D_1, \ldots$ and $D_N$ and M bit (M is an integer of more than 1) digital signals $E_0, E_1, \ldots$ and $E_M$ different from the N bit digital signals to the control signal generator.

It is more preferable that the N bit digital signals are 3 bit digital signals $D_0, D_1,$ and $D_2$ and the M bit digital signals are $E_0, E_1$ and $E_2$.

It is preferable that the step of (b) includes a step of: selecting a first frequency band mode if $D_2$ is 0 and selecting a second frequency band mode different from the first frequency band mode if $D_2$ is 1.

It is preferable that the step of (c) includes a step of: adjusting the oscillation frequency at 4 levels in the selected frequency band mode in the step of (b) according to combinations of ($D_1, D_0$) in the first frequency band mode and the second frequency band mode.

It is preferable that the step of (d) includes a step of: re-adjusting the adjusted oscillation frequency in the step of (c) at 8 levels according to combinations of ($E_0, E_1, E_2$).

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 shows a circuit diagram of a VCO 100 in accordance with the prior art;

FIG. 2 shows a circuit diagram of a broadband voltage controlled oscillator 200 in accordance with one embodiment of the present invention;

FIG. 3 illustrates a circuit diagram of a weighted current cell 260 of the broadband voltage controlled oscillator 200;

FIG. 4 illustrates a circuit diagram of a capacitor bank 230 of the broadband voltage controlled oscillator 200; and FIG. 5 illustrates a circuit diagram of a variable frequency tank 240 of the broadband voltage controlled oscillator 200.

DETAILED DESCRIPTION OF THE PREFERABLE EMBODIMENTS

Hereinafter, preferable embodiments of the present invention will be described in detail with reference to the accompanying drawings.

FIG. 2 shows a circuit diagram of a broadband voltage controlled oscillator 200 in accordance with one embodiment of the present invention.

As shown in FIG. 2, the broadband voltage controlled oscillator 200 in accordance with the one embodiment of the present invention includes a first negative-resistance unit 210, an inductor 220, a capacitor bank 230, a variable frequency tank 240, a second negative-resistance unit 250, a weighted current cell 260 and a control signal generator 270.

As described above, a resonant frequency of a resonant circuit is determined by an equation of $f=1/(L/C)^{1/2}$ but practically used capacitor and inductor have loss resistance, which causes loss in the resonant circuit and so an amplitude of an output voltage is gradually reduced. Therefore, negative-resistance is needed in order to enable stable resonance by supplying energy to an LC resonant circuit. The first negative-resistance unit 210 and the second negative-resistance unit 250 form positive feedbacks by connecting gates and drains of two transistors respectively in order to keep oscillation.

The inductor 220 is an element needed for constituting the resonant circuit together with the capacitor and an inductance value thereof is fixed in the one embodiment of the present invention.

The control signal generator 270 includes a first input terminal 271 to which N bit (N is an integer of more than 1) digital signals $D_0, D_1, \ldots$ and $D_N$ are inputted and a second input terminal 272 to which M bit (M is an integer of more than 1) digital signals $E_0, E_1, \ldots$ and $E_M$ different from the N bit digital signals are inputted. In the one embodiment, the N bit digital signals can be 3 bit digital signals $D_0, D_1$ and $D_2$ and the M bit digital signals can be 3 bit digital signals $E_0, E_1$, and $E_2$ different from the 3 bit digital signals $D_0, D_1$, and $D_2$ and hereinafter, this case will described.

The control signal generator 270 receives 6 bit digital signals, i.e., $D_0, D_1, D_2, E_0, E_1$, and $E_2$ and converts the received 6 bit digital signals into a weighted current cell control signal, a variable frequency tank control signal and a capacitor bank control signal respectively by a BDD (Binary Decision Diagram) technique. The converted weighted current cell control signal, variable frequency tank control signal and capacitor bank control signal are inputted to the weighted current cell 260, the variable frequency tank 240 and the capacitor bank 230 respectively. Herein, the BDD technique will be apparent to those skilled in the art to which the present invention pertains.

FIG. 3 illustrates a circuit diagram of the weighted current cell 260 of the broadband voltage controlled oscillator 200 in accordance with the one embodiment of the present invention. The weighted current cell 260 is a tail current source which allows a current to symmetrically flow to the broadband voltage controlled oscillator 200 in accordance with the one embodiment of the present invention. Particularly, the weighted current cell 260 in accordance with the one embodiment of the present invention can select one of a first frequency band mode and a second frequency band mode by changing a value of the current flowing through the weighted current cell 260. Particularly, an oscillation frequency in the first frequency band mode can be 600~900 MHz and an oscillation frequency in the second frequency band mode can be 1.6~1.9 GHz. Hereinafter, in accordance with the one embodiment of the present invention, the case, where the oscillation frequencies are 600~900 MHz and 1.6~1.9 GHz in each of the first frequency band mode and the second frequency band mode, will be described.

More specifically, the weighted current cell 260 changes the value of the flowing current according to a value of $D_2$ so that if $D_2$ among the 6 bit digital signals inputted to the control signal generator 270 is 0, the first frequency band mode in which the oscillation frequency is 600~900 MHz is selected and if $D_2$ is 1, the second frequency band mode in which the oscillation frequency is 1.6~1.9 GHz is selected.

The weighted current cell 260 includes a first stage 261 for supplying a constant current to the weighted current cell 260, a second stage 262 for supplying a current quantity needed to select the first frequency band mode and a third stage 263 for supplying a current quantity needed to select the second frequency band mode. Herein, the first stage 261 includes a current source 261a, a first transistor 261b and a second transistor 261c which are connected to each other in series, the second stage 262 includes a first switch 262a, a third transistor 262b and a fourth transistor 262c which are connected to each other in series, and the third stage 263 includes a second switch 263a, a fifth transistor 263b and a sixth transistor 263c which are connected to each other in series.

The first switch 262a and the second switch 263a are complementarily opened and closed according to the value of $D_2$ among the 6 bit digital signals inputted to the control signal generator 270. In other words, if $D_2$ is 0, the first switch 262a is conducted and the second switch 263a is interrupted so that the current flowing through the weighted current cell 260 becomes a current flowing in the second stage 262 and on the contrary, if $D_2$ is 1, the first switch 262a is interrupted and the second switch 263a is conducted so that the current flowing through the weighted current cell 260 becomes a current flowing in the third stage 263.

Quantity of the current flowing in the second stage 262 and quantity of the current flowing in the third stage 263 are determined by ratios (W/L) of channel width (W) to channel length (L) of each of the transistors constituting the second stage 262 and the third stage 263. At this time, ratios of channel width to channel length of the first transistor 261b and the second transistor 261c of the first stage 261 are equal to each other, ratios of channel width to channel length of the third transistor 262b and the fourth transistor 262c of the second stage 262 are equal to each other, and ratios of channel width to channel length of the fifth transistor 263b and the sixth transistor 263c of the third stage 263 are equal to each other.

The quantity ($I_2$) of the current flowing in the second stage 262 is expressed as the following equation:

$$I_2 = I_1 \times \{(3\_W/L)/(1\_W/L)\} \text{ and}$$

the quantity ($I_3$) of the current flowing in the third stage 263 is expressed as the following equation:

$$I_3 = I_1 \times \{(5\_W/L)/(1\_W/L)\}$$

(wherein, $I_1$ is the quantity of the current flowing in the first stage 261, $1\_W/L$ is a ratio of channel width to channel length of the first transistor 261b, $3\_W/L$ is a ratio of channel width to channel length of the third transistor 262b, and $5\_W/L$ is a ratio of channel width to channel length of the fifth transistor 263b).

Therefore, it is possible to adjust the current quantity needed to select the first frequency band mode and the current quantity needed to select the second frequency band mode by adjusting the ratio of channel width to channel length of the third transistor 262b/the ratio of channel width to channel length of the first transistor 261b and the ratio of channel width to channel length of the fifth transistor 263b/the ratio of channel width to channel length of the first transistor 261b. For instance, in order to select the first frequency band mode, if the double of current supplied by the current source 261a is required, the ratio of channel width to channel length of the third transistor 262b is doubled in comparison with the ratio of channel width to channel length of the first transistor 261b.

Further, it will be appreciated by those skilled in the art to which the present invention pertains that additional circuits can be added to the weighted current cell in the same manner as the second stage 262 and the third stage 263 are arranged. In this case, ratios of channel width to channel length of transistors constituting the additional circuits are larger than the ratios of channel width to channel length of the transistors constituting the second stage 262 and the third stage 263 and in order to generate the weighted current cell control signal in the control signal generator 270, a digital signal of more than two bits not a 1 bit digital signal described the above may be used.

As described above, it is possible to generate the oscillation frequency in a wide frequency band of 600~900 MHz or 1.6~1.9 GHz by using the weighted current cell 260. Further, it is possible to reduce power consumption of the broadband voltage controlled oscillator 200 by varying the quantity of the current flowing in the weighted current cell 260 according to the frequency band mode, i.e., needing a smaller quantity of current to generate the oscillation frequency in a low frequency band.

FIG. 4 illustrates the capacitor bank 230 of the broadband voltage controlled oscillator 200 in accordance with the one embodiment of the present invention.

The capacitor bank 230 adjusts the oscillation frequency at a plurality of levels in the frequency band mode selected by the weighted current cell 260. The capacitor bank 230 shown in FIG. 4 adjusts the oscillation frequency at four levels by each of the frequency band modes according to $D_1$ and $D_0$ among signals inputted to the control signal generator. For instance, in the first frequency band mode in which the oscillation frequency is 600~900 MHz, if $(D_1,D_0)$ is (0,0); (0,1); (1,0), (1,1), the capacitor bank 230 can adjust the oscillation frequency to be 600 MHz, 700 MHz, 800 MHz and 900 MHz respectively and further in the second frequency band mode in which the oscillation frequency is 1.6~1.9 GHz, if $(D_1,D_0)$ is (0,0); (0,1); (1,0), (1,1), the capacitor bank 230 can adjust the oscillation frequency to be 1.6 GHz, 1.7 GHz, 1.8 GHz and 1.9 GHz respectively. Four different levels of the oscillation frequency by each of the frequency band modes can be changed according to capacitance of a capacitor of each capacitor unit.

For this operation, the capacitor bank 230 can be formed by connecting four capacitor units 231 to 234 in parallel as shown in FIG. 4. At this time, each of the capacitor units 231 to 234 includes a capacitor switch 231a to 234a and a capacitor 231b to 234b which are connected to each other in series. Conducted capacitor switches among the capacitor switches 231a to 234a are different according to combinations of ($D_1$, $D_0$) in the first frequency band mode and the second frequency band mode and thus have different capacitance. In other words, it is possible to adjust the oscillation frequency at 4 different levels in each of the first frequency band mode and the second frequency band mode.

It will be appreciated by those skilled in the art to which the present invention pertains that the capacitor bank 230 of the broadband voltage controlled oscillator 200 in accordance with the one embodiment of the present invention can be changed in the number of the capacitor units if necessary. In case that the number of the levels to be adjusted increases, digital signals of more than 3 bits not the 2 bit digital signals ($D_1,D_0$) may be used in the control signal generator 270. Further, it is possible to constitute the capacitor bank by using the capacitor units of the smaller number than the number of the levels of the oscillation frequency to be adjusted by programming the control signal generator 270 to conduct one or more capacitor switches without conducting the capacitor switches one by one according to combinations of ($D_0,D_1$). Undoubtedly, even in this case, combinations of the conducted capacitor switches should be different according to the combinations of ($D_0,D_1$).

FIG. 5 illustrates the variable frequency tank 240 of the broadband voltage controlled oscillator 200 in accordance with the one embodiment of the present invention.

The variable frequency tank 240 re-adjusts the oscillation frequency adjusted by the capacitor bank 230 at a plurality of levels. The variable frequency tank 240 of the broadband voltage controlled oscillator 200 in accordance with the one embodiment of the present invention re-adjusts the frequency adjusted by the capacitor bank 230 at 8 different levels according to values of input $E_0$, $E_1$ and $E_2$ of the control signal generator 270.

For this operation, the variable frequency tank 240 can be formed by connecting 8 varactor units 241 to 248 in parallel as shown in FIG. 5. Each of the varactor units 241 to 248 includes a varactor switch 241a to 248a and a varactor 241b to 248b which are connected in series. One of the varactor switches 241a to 248a is conducted according to combinations of ($E_0$, $E_1$,$E_2$). The conducted varactor switch is different according to the combinations of ($E_0$, $E_1$,$E_2$) and thus has different capacitance. That is, the oscillation frequency adjusted by the capacitor bank 230 can be adjusted at the 8 different levels again respectively. At this time, the 8 levels of the oscillation frequency can be changed according to capacitance of the varactor of each of the varactor units. Therefore, the broadband voltage controlled oscillator 200 in accordance with the one embodiment of the present invention has the two frequency band modes, adjusts the frequency at the 4 levels by each of the frequency band modes and re-adjusts the frequency at the 8 levels in order to generate the oscillation frequency of total 64 levels obtained by multiplying 2 by 4 and 8.

Like the capacitor bank 230, it will be appreciated by those skilled in the art to which the present invention pertains that the variable frequency tank 240 of the broadband voltage controlled oscillator 200 in accordance with the one embodiment of the present invention can be changed in the number of the varactor units if necessary. In case that the number of the levels to be adjusted increases, digital signals of more than 4 bits not the 3 bit digital signals $E_1$,$E_0$ and $E_1$ may be used in the control signal generator 270. Further, it is possible to constitute the variable frequency tank by using the varactor units of the smaller number than the number of the levels of the oscillation frequency to be adjusted by programming the control signal generator 270 to conduct one or more varactor switches according to the combinations of ($E_1$,$E_0$, $E_1$).

The following [Table 1] represents oscillation frequencies of the broadband voltage controlled oscillator 200 in accordance with the one embodiment of the present invention according to the 6 bit digital input signals inputted to the control signal generator 270. For convenience, $E_0$, $E_1$ and $E_2$ are omitted.

TABLE 1

| $D_2$ | $D_1$ | $D_0$ | Oscillation frequency | Classification |
|---|---|---|---|---|
| 1 | 1 | 1 | 1.9 GHz + ($a_0$~$a_7$) | First frequency band mode |
| 1 | 1 | 0 | 1.8 GHz + ($a_0$~$a_7$) | |
| 1 | 0 | 1 | 1.7 GHz + ($a_0$~$a_7$) | |
| 1 | 0 | 0 | 1.6 GHz + ($a_0$~$a_7$) | |
| 0 | 1 | 1 | 900 MHz + ($a_0$~$a_7$) | Second frequency band mode |
| 0 | 1 | 0 | 800 MHz + ($a_0$~$a_7$) | |
| 0 | 0 | 1 | 700 MHz + ($a_0$~$a_7$) | |
| 0 | 0 | 0 | 600 MHz + ($a_0$~$a_7$) | |

As described above, the frequency band modes are determined according to the value of $D_2$ and the oscillation frequencies are adjusted at the 4 different levels in each of the frequency band modes according to the combinations of ($D_1$, $D_0$). Further, the oscillation frequencies are adjusted at the 8 different levels by adding fine frequencies of $a_0$~$a_7$ according to the combinations of ($E_0$,$E_1$,$E_2$). Sizes of the fine frequencies of $a_0$~$a_7$, as described above, can be adjusted according to the capacitance of the varactors of the varactor units of the variable frequency tank 240.

Hereinafter, a method for generating a broadband oscillation frequency in accordance with one embodiment of the present invention will be described.

The method for generating the broadband oscillation frequency in accordance with the one embodiment of the present invention includes the steps of: (a) receiving digital signals and converting the digital signals into control signals each of which is applied to a weighted current cell, a capacitor bank and a variable frequency tank by a BDD (Binary Decision Diagram) technique by a control signal generator; (b) selecting a plurality of frequency band modes by the weighted current cell; (c) adjusting an oscillation frequency at a plurality of levels in the selected frequency band mode by the capacitor bank; and (d) re-adjusting the adjusted oscillation frequency at a plurality of levels by the variable frequency tank.

At this time, the step of (a) includes a step of: inputting N bit (N is an integer of more than 1) digital signals $D_0, D_1, \ldots$ and $D_N$ and M bit (M is an integer of more than 1) digital signals $E_0, E_1, \ldots$ and $E_M$ different from the N bit digital signals to the control signal generator.

At this time, the N bit digital signals can be 3 bit digital signals $D_0$, $D_1$ and $D_2$ and the M bit digital signals can be $E_0$, $E_1$ and $E_2$.

Further, the step of (b) includes a step of: selecting a first frequency band mode if $D_2$ is 0 and selecting a second frequency band mode different from the first frequency band mode if $D_2$ is 1.

Further, the step of (c) includes a step of: adjusting the oscillation frequency at 4 levels in the selected frequency band mode in the step of (b) according to combinations of $(D_1, D_0)$ in the first frequency band mode and the second frequency band mode.

Further, the step of (d) includes a step of: re-adjusting the adjusted oscillation frequency in the step of (c) at 8 levels according to combinations of $(E_0, E_1, E_2)$.

As described above, the broadband voltage controlled oscillator and the method for generating the broad oscillation frequency in accordance with the present invention can operate over the wide frequency band by including the weighted current cell to select the two frequency band modes, generate various levels of total 64 oscillation frequencies by including the variable frequency tank and the capacitor bank, and facilitate adjustment of the total 64 oscillation frequencies distributed over the wide frequency band by including the control signal generator for generating the control signals each of which is applied to the weighted current cell, the variable frequency tank and the capacitor bank by the BDD (Binary Decision Diagram) technique.

As described above, although the preferable embodiments of the present invention have been shown and described, it will be appreciated by those skilled in the art that substitutions, modifications and changes may be made in these embodiments without departing from the principles and spirit of the general inventive concept, the scope of which is defined in the appended claims and their equivalents.

What is claimed is:

1. A broadband voltage controlled oscillator comprising:
   a weighted current cell for selecting a plurality of frequency band modes;
   a capacitor bank for adjusting an oscillation frequency at a plurality of levels in the frequency band mode selected by the weighted current cell;
   a variable frequency tank for re-adjusting the oscillation frequency adjusted by the capacitor bank at a plurality of levels; and
   a control signal generator for receiving digital signals and converting the digital signals into control signals each of which is applied to the weighted current cell, the capacitor bank and the variable frequency tank.

2. The broadband voltage controlled oscillator of claim 1, wherein the control signal generator includes:
   a first input terminal to which N bit digital signals $D_0$ through $D_{N-1}$, N being an integer greater than 1 are inputted, and
   a second input terminal to which M bit digital signals $E_0$ through $E_{M-1}$, M being an integer greater than 1 are different from the N bit digital signals are inputted.

3. The broadband voltage controlled oscillator of claim 2, wherein the N bit digital signals are 3 bit digital signals $D_0$, $D_1$ and $D_2$ and the M bit digital signals are $E_0$, $E_1$, and $E_2$.

4. The broadband voltage controlled oscillator of claim 3, wherein the weighted current cell selects a first frequency band mode if $D_2$ is 0 and selects a second frequency band mode different from the first frequency band mode if $D_2$ is 1.

5. The broadband voltage controlled oscillator of claim 4, wherein the weighted current cell includes:
   a first stage including a current source, a first transistor and a second transistor which are connected to each other in series and supplying a constant current to the weighted current cell;
   a second stage including a first switch, a third transistor and a fourth transistor which are connected to each other in series and supplying a current quantity needed to select the first frequency band mode; and
   a third stage including a second switch, a fifth transistor and a sixth transistor which are connected to each other in series and supplying a current quantity needed to select the second frequency band mode.

6. The broadband voltage controlled oscillator of claim 5, wherein the first switch and the second switch are complementarily opened and closed according to a value of $D_2$.

7. The broadband voltage controlled oscillator of claim 6, wherein ratios (W/L) of channel width (W) to channel length (L) of the first transistor and the second transistor are equal to each other, ratios of channel width to channel length of the third transistor and the fourth transistor are equal to each other, and ratios of channel width to channel length of the fifth transistor and the sixth transistor are equal to each other.

8. The broadband voltage controlled oscillator of claim 7, wherein quantity ($I_2$) of a current flowing in the second stage is expressed as the following equation:

$$I_2 = I_1 \times \{(3\_W/L)/(1\_W/L)\} \text{ and}$$

quantity ($I_3$) of a current flowing in the third stage is expressed as the following equation:
$I_3 = I_1 \times \{(5\_W/L)/(1\_W/L)\}$ (wherein, $I_1$ is quantity of a current flowing in the first stage, $1\_W/L$ is a ratio of channel width to channel length of the first transistor, $3\_W/L$ is a ratio of channel width to channel length of the third transistor, and $5\_W/L$ is a ratio of channel width to channel length of the fifth transistor).

9. The broadband voltage controlled oscillator of claim 4, wherein the oscillation frequency adjusted by the capacitor bank is adjusted at 4 levels in each of the first frequency band mode and the second frequency band mode according to combinations of $(D_1, D_0)$.

10. The broadband voltage controlled oscillator of claim 9, wherein the capacitor bank includes a plurality of capacitor units connected to each other in parallel and each of the capacitor units includes a single capacitor and a single capacitor switch connected to the capacitor in series.

11. The broadband voltage controlled oscillator of claim 10, wherein each combination of conducted capacitor switches among the capacitor switches of the capacitor units is different according to the combinations of $(D_1, D_0)$ in the first frequency band mode and the second frequency band mode.

12. The broadband voltage controlled oscillator of claim 9, wherein the variable frequency tank re-adjusts the frequency adjusted by the capacitor bank at 8 levels according to combinations of ($E_0$, $E_1$, $E_2$).

13. The broadband voltage controlled oscillator of claim 12, wherein the variable frequency tank includes a plurality of varactor units connected to each other in parallel and each of the varactor units includes a single varactor and a single varactor switch connected to the varactor in series.

14. The broadband voltage controlled oscillator of claim 13, wherein each combination of conducted varactor switches among the varactor switches of the varactor units is different according to the combinations of ($E_0$, $E_1$, $E_2$) in the first frequency band mode and the second frequency band mode.

15. A method for generating a broadband oscillation frequency comprising steps of:
(a) receiving digital signals and converting the digital signals into control signals each of which is applied to a weighted current cell, a capacitor bank and a variable frequency tank by a control signal generator;
(b) selecting a plurality of frequency band modes by the weighted current cell;
(c) adjusting an oscillation frequency at a plurality of levels in the selected frequency band mode by the capacitor bank; and
(d) re-adjusting the adjusted oscillation frequency at a plurality of levels by the variable frequency tank.

16. The method of claim 15, wherein the step of (a) includes a step of:
inputting N bit digital signals $D_0$ through $D_{N-1}$, N being an integer greater than 1, and inputting M bit digital signals $E_0$ through $E_{M-1}$, M being an integer greater than 1 different from the N bit digital signals to the control signal generator.

17. The method of claim 16, wherein the N bit digital signals are 3 bit digital signals $D_0$, $D_1$ and $D_2$ and the M bit digital signals are $E_0$, $E_1$ and $E_2$.

18. The method of claim 17, wherein the step of (b) includes a step of:
selecting a first frequency band mode if $D_2$ is 0 and selecting a second frequency band mode different from the first frequency band mode if $D_2$ is 1.

19. The method of claim 18, wherein the step of (c) includes a step of:
adjusting the oscillation frequency at 4 levels in the selected frequency band mode in the step of (b) according to combinations of ($D_1$, $D_0$) in the first frequency band mode and the second frequency band mode.

20. The method of claim 17, wherein the step of (d) includes a step of:
re-adjusting the adjusted oscillation frequency in the step of (c) at 8 levels according to combinations of ($E_0$, $E_1$, $E_2$).

* * * * *